US005436923A

United States Patent [19]
Nagai

[11] Patent Number: 5,436,923
[45] Date of Patent: Jul. 25, 1995

[54] SEMICONDUCTOR LASER INCLUDING LIGHT REFLECTING LAYER

[75] Inventor: Yutaka Nagai, Itami, Japan

[73] Assignee: Mitsubishi Denki Kabushiki Kaisha, Tokyo, Japan

[21] Appl. No.: 205,377

[22] Filed: Mar. 4, 1994

[30] Foreign Application Priority Data

Apr. 28, 1993 [JP] Japan .................. 5-102345

[51] Int. Cl.$^6$ ............................................. H07S 3/19
[52] U.S. Cl. ........................................ 372/46; 372/45
[58] Field of Search ................................ 372/46, 45

[56] References Cited

U.S. PATENT DOCUMENTS 4,615,032  9/1986  Holbrook .................. 372/45

FOREIGN PATENT DOCUMENTS

| 3006877 | 6/1989 | European Pat. Off. . |
| 3194989 | 12/1989 | European Pat. Off. . |
| 452146 | 4/1991 | European Pat. Off. . |
| 477013 | 9/1991 | European Pat. Off. . |
| 48-48081 | 7/1973 | Japan . |
| 62-147792 | 7/1987 | Japan . |
| 2228089 | 9/1990 | Japan . |
| 2221094 | 7/1989 | United Kingdom . |

OTHER PUBLICATIONS

Jost et al, "Ridge Formation for AlGaAs GRINSCH Lasers by Cl$_2$ Reactive Ion Etching," IEEE Photonics Technology Letters, vol. 2 No. 10, Oct. 1990, pp. 697–698.
Nakatsuka et al, "A New Self-Aligned Structure For (GaAl) As High Power Lasers With Seletively Grown Light Absorbing GaAs Layers Fabricated By MOCVD", Japanese Journal of Applied Physics, vol. 25, No. 6, Jun. 1986, pp. L498–L500.

*Primary Examiner*—James W. Davie
*Attorney, Agent, or Firm*—Leydig, Voit & Mayer

[57] ABSTRACT

A semiconductor laser device includes: a first conductivity type semiconductor substrate; a first conductivity type lower cladding layer on the semiconductor substrate; an active layer on the upper cladding layer; a second conductivity type first upper cladding layer on the active layer; a second conductivity type $Al_zGa_{1-z}As$ light reflecting layer on the first upper cladding layer, where z is at least 0.6; a second conductivity type second upper cladding layer of $Al_yGa_{1-y}As$ including a stripe shaped ridge region portion and thin film layer portions on the light reflecting layer; and first conductivity type current blocking layers disposed on both side thin film portions of the second upper cladding layer, burying the ridge region portion. Therefore, the surface defect density can be reduced form $10^6/cm^2$ in the prior art to $10^4/cm^2$, and thus the surface morphology is improved to a great extent and a high reliability semiconductor laser device having preferable device characteristics is obtained. When the total thickness of the first upper cladding layer, the light reflecting layer, the thin film layer portion of second upper cladding layer is no more than 0.3 μm, there is no idle current which causes the injected current to become broadened in the transverse direction under the current blocking layers, whereby preferable device characteristics are obtained.

6 Claims, 5 Drawing Sheets

SEMICONDUCTOR LASER INCLUDING LIGHT REFLECTING LAYER

FIELD OF THE INVENTION

The present invention relates to a semiconductor laser and a production method thereof and, more particularly, to a buried ridge semiconductor laser having a p-type cladding layer on a light reflecting layer.

BACKGROUND OF THE INVENTION

Figure 2:
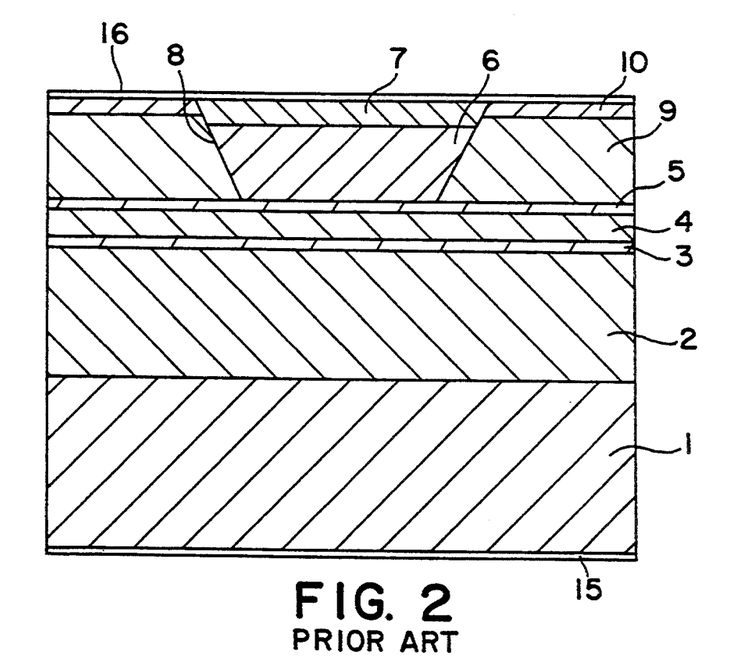
FIGS. 2 is a cross-sectional view of a prior art semiconductor laser.

FIG. 2 is a cross-sectional view of a buried ridge semiconductor laser diode (hereinafter referred to as an ES-LD) with an etch stopping layer (hereinafter referred to as an ES layer). This laser has an n-type GaAs substrate 1 as a substrate. An n-type $Al_{0.5}Ga_{0.5}As$ cladding layer 2 is disposed on the n-type GaAs substrate 1 and a multi-quantum well (hereinafter referred to as MQW) structure active layer 3 comprising GaAs and $Al_{0.2}Ga_{0.8}As$ is disposed on the n-type cladding layer 2. A p-type $Al_{0.5}Ga_{0.5}As$ first cladding layer 4 and an AlGaAs etch stopping layer 5 having an Al composition ratio above 0.6 are successively disposed on the MQW active layer 3. A p-type $Al_{0.5}Ga_{0.5}As$ second cladding layer 6 in a ridge shape 8 together with a p-type GaAs contact layer 7 on the layer 6 and n-type current blocking layers 9 at both sides of the ridge 8 and including Zn diffused regions 10 containing Zn as a p-type dopant are disposed on the etch stopping layer 5. An n side electrode 15 is on the rear surface of the n-type GaAs substrate 1 and a p side electrode 16 is on the p-type GaAs contact layer 7 and the Zn diffused regions 10 at the front surface of the device.

To operate the semiconductor laser, a forward direction voltage is applied between the p side electrode 16 and the n side electrode 15, electrons are injected from the n-type GaAs substrate 1, and holes are injected from the p-type cap layer (contact layer) 7. The injected holes are confined to the central portion of the element by the n-type GaAs current blocking layers 9 and the electrons and holes efficiently recombine in the active layer 3 directly below the ridge 8, thus emitting light having a wavelength corresponding to the energy band gap of the active layer 3. In this prior art device, the emitted light has a wavelength of 780 nm. The light generated directly below the ridge 8 tends to be broadened along the active layer 3 in the horizontal direction. Because of the light absorption due to the current blocking layers 9 disposed in the vicinity of the active layer 3, there is an effective refractive index different in the active layer 3 in the horizontal direction so that light is confined within the ridge 8. This light confinement in the width direction largely depends on the thickness of the p-type $Al_{0.5}Ga_{0.5}As$ first cladding layer 4. The best device characteristics are obtained when the thickness of the first cladding layer 4 is 0.2–0.3 μm.

FIGS. 3(a)–3(d) illustrate a process for forming the ridge of the ES-LD shown in FIG. 2. The same reference numerals are used to designate the same elements as those in FIG. 2.

Figure 3A:
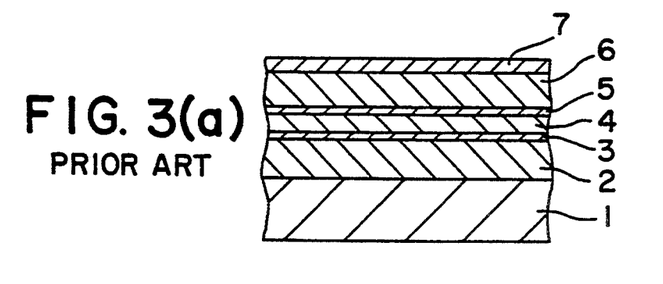
FIGS. 3(a)-3(d) are diagrams for explaining production of the prior art semiconductor device.

As shown in FIG. 3(a), a metal organic chemical vapor deposition (MOCVD) process is used to grow the n-type AlGaAs cladding layer 2, the active layer 3, the p-type AlGaAs first cladding layer 4, the AlGaAs etch stopping layer 5, the p-type AlGaAs second cladding layer 6, and the p-type GaAs contact layer 7 successively and epitaxially on the n-type GaAs substrate 1.

Figure 3B:
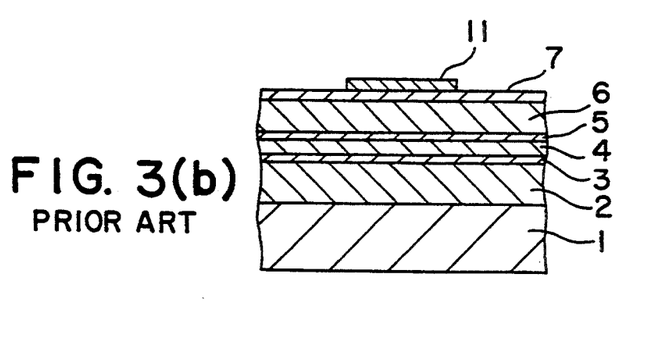

Thereafter, an insulating film, comprising SiN or SiO, is formed on the wafer by sputtering, thermal CVD, or plasma CVD, photoresist is deposited on the insulating film, and photolithography and etching are performed to form a stripe-shaped insulating film 11 having a width corresponding to the width of a ridge that is produced later.

Figure 3C:
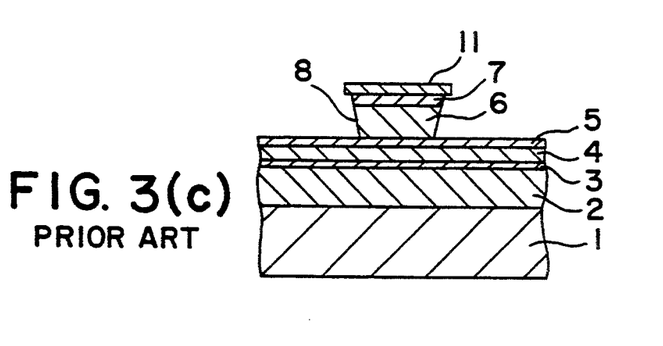

Next, as shown in FIG. 3(c), portions of the contact layer 7 and portions of the second cladding layer 6, other than at the ridge, are removed by etching employing the insulating film 11 as an etching mask. Etching is stopped by the etch stopping layer 5 by employing an etchant that does not etch an AlGaAs layer having an Al composition ratio above 0.6 but that does etch an AlGaAs layer having an Al composition ratio below 0.6. For example, a solution of tartaric acid and hydrogen peroxide can be employed. Thus, it is possible to keep the thickness of the p-type first cladding layer 4 constant, significantly affecting and providing preferable device characteristics.

Figure 3D:
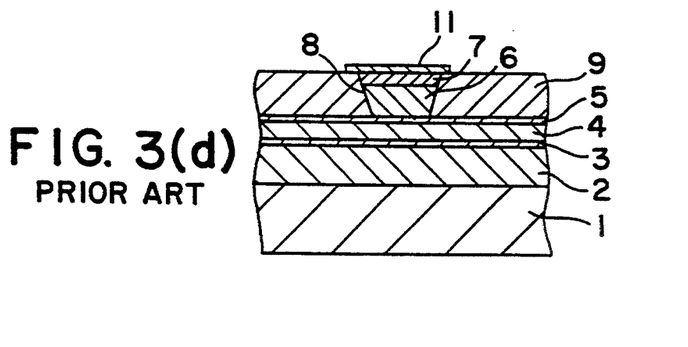

Thereafter, the n-type GaAs current blocking layers 9 at both sides of the ridge 8 are epitaxially grown, burying the ridge 8 (FIG. 3(d)).

Finally, the Zn diffused regions 10 are formed at upper portions of the current blocking layers 9 by ion implantation employing the film 11 as a mask. The insulating film is then removed, completing the device. The Zn diffused regions 10 may also be performed by solid phase diffusion.

In the prior art ES-LD constructed as described above, the current blocking layer 9 is disposed on the etch stopping layer 5 having an Al composition ratio above 0.6. However, since that AlGaAs etch stopping layer has a high Al composition ratio, it has a thick surface oxide film. As a result, layers epitaxially grown in that surface have a density of surface defects in excess of $10^6/cm^2$, thereby significantly deteriorating surface morphology. In addition, a leakage current flows through the surface defects and makes no contribution to the device operation. The leakage current increases with time, significantly reducing device reliability.

SUMMARY OF THE INVENTION

It is an object of the present invention to provide a semiconductor laser that has a grown current blocking layer grown on a thin film of a second conductivity type, i.e., a p-type second cladding layer having a low surface defect density, and that has preferable device characteristics and high reliability.

It is another object of the present invention to provide a method of producing a semiconductor laser including a thin second conductivity type second cladding layer with high reproducibility that provides reproducible, uniform device characteristics.

Other objects and advantages of the present invention will become apparent from the detailed description given hereinafter. It should be understood, however, that the detailed description and specific embodiments are given by way of illustration only since various changes and modifications within the scope of the invention will become apparent to those skilled in the art from this detailed description.

According to a first aspect of the present invention, a semiconductor laser device includes a first conductivity type semiconductor substrate; a first conductivity type lower cladding layer disposed on the first conductivity type semiconductor substrate; an active layer disposed on the lower cladding layer; a second conductivity type first upper cladding layer disposed on the active layer; a second conductivity type $Al_zGa_{1-z}As$ light reflecting layer disposed on the first upper cladding layer, where z is at least 0.6; a second conductivity type second upper cladding layer comprising $Al_yGa_{1-y}As$, including a stripe-shaped ridge and thin film layer portions, disposed on the light reflecting layer; and first conductivity type current blocking layers disposed on both sides of the second upper cladding layer, burying the ridge. In this structure, the surface defect density is reduced from $10^6/cm^2$ to $10^4/cm^2$ so that surface morphology is significantly improved and a highly reliable semiconductor laser device having preferred device characteristics is obtained.

According to a second aspect of the present invention, a semiconductor laser device has a total thickness of a first upper cladding layer, a light reflecting layer, and a thin film layer portion of a second upper cladding layer no thicker than 0.3 μm. In this structure, there is no flow of an idle current that otherwise flows due to broadening of the flow of current injected under the current blocking layers so that preferred device characteristics are obtained.

According to a third aspect of the present invention, a method of producing a semiconductor laser device includes successively epitaxially growing a first conductivity type lower cladding layer, an active layer, a second conductivity type first upper cladding layer, a second conductivity type $Al_zGa_{1-z}As$ light reflecting layer, where z is at least 0.6, a second conductivity type second upper cladding layer comprising $Al_yGa_{1-y}As$, and a second conductivity type first contact layer on a first semiconductor substrate. The first contact layer and the second upper cladding layer are etched, producing a stripe-shaped ridge and leaving thin film portions of the second upper cladding layer at both sides of the ridge. First conductivity type current blocking layers are grown on the thin film layer portions of the second upper cladding layer and bury the ridge. A second conductivity type second contact layer is formed over the entire top surface of the ridge and the current blocking layers. This process produces significantly improved surface morphology and a highly reliable semiconductor laser device having preferred device characteristics.

According to fourth and fifth aspects of the present invention, the process of leaving thin film portions at both sides of the second upper cladding layer comprises observing light interference produced when light irradiates the second upper cladding layer, is reflected by the light reflecting layer, and interferes with the incident light in the second upper cladding layer, and stopping the etching when a predetermined time has passed after the interference is first seen or when a particular wavelength light is observed a predetermined number of times.

By changing the duration of etching or the number of times a particular wavelength light is observed as the point for stopping etching, the thickness of the thin film can be controlled and, therefore, the second upper cladding layer can be made very thin, with a highly reproducible thickness, and highly reliable semiconductor laser devices that are superior in reproducibility and uniformity of characteristics are obtained.

According to a sixth aspect of the present invention, the process of leaving the thin film portions at both sides of the second upper cladding layer comprises, after production of the contact layer, producing a groove having a depth corresponding to the thickness of the thin film at the surface of the contact layer that is subjected to ridge etching, observing light interference in light that irradiates the second upper cladding layer at the groove, is reflected by the light reflecting layer, and interferes with the incident light in the second upper cladding layer at the groove, and stopping the etching when the interference disappears, leaving thin film layer portions at both sides of the second upper cladding layer. In this method, the thin film portions of the second upper cladding layer can be left with a higher precision on the light reflecting layer and highly reliable semiconductor laser devices that are superior in reproducibility and uniformity of characteristics are obtained.

DETAILED DESCRIPTION OF PREFERRED EMBODIMENTS

Embodiment 1

Figure 1:
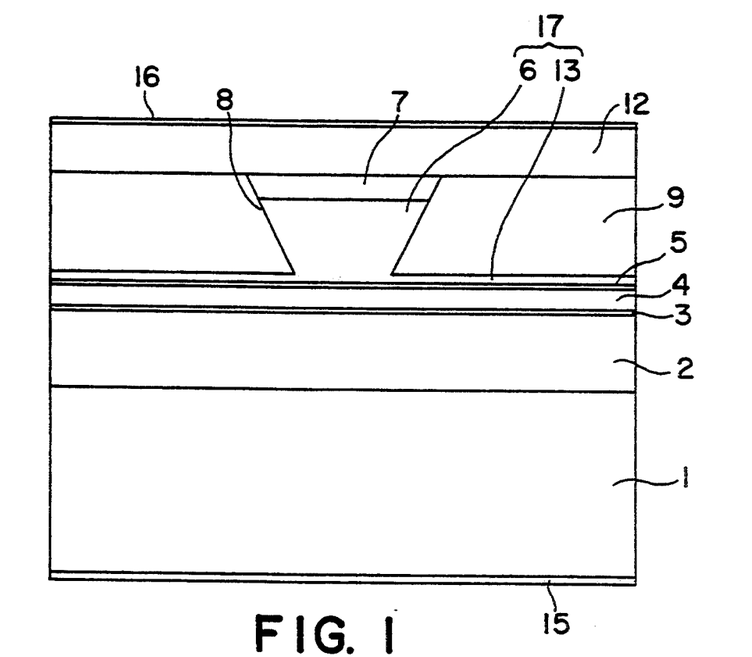
FIG. 1 is a cross-sectional view of a semiconductor laser according to a first embodiment of the present invention.

FIG. 1 is a diagram showing a semiconductor laser according to a first embodiment of the present invention. The same reference numerals are used to designate the same or corresponding elements as in the other figures.

On the n-type GaAs substrate 1 are successively disposed an n-type $Al_{0.5}Ga_{0.5}As$ cladding layer 2 having a thickness of 1.0 to 2.0 μm and a carrier concentration of $5.0 \times 10^{-17} cm^{-3}$; a multi-quantum well (MQW) structure including, alternatingly laminated, a plurality of GaAs layers and AlGaAs layers having an Al composition less than 0.15 and a thickness less than 0.2 μm; a p-type $Al_{0.5}Ga_{0.5}As$ first cladding layer 4 having a thickness of 0.2 to 0.4 μm and a carrier concentration of $2.0 \times 10^{18} cm^{-3}$; and an $Al_zGa_{1-z}As$ light reflecting layer 5 having an Al composition ratio z larger than 0.6, a thickness less than 0.1 μm, and a carrier concentration of $2.0 \times 10^{18} cm^{-3}$. On the light reflecting layer 5, a p-type $Al_{0.5}Ga_{0.5}As$ second cladding layer 17 comprising a stripe-shaped ridge 6 having a bottom edge length of 4 μm, an upper edge length of 6 μm, and a height of 2 μm and thin films 13 having a thickness less than 3 μm, including the thickness of the first cladding layer 4 and the thickness of the light reflecting layer 5, and a carrier concentration of $2.0 \times 10^{18} cm^{-3}$, is disposed. A p-type GaAs first contact layer 7, also in a ridge shape, is disposed on the ridge 6 of the second cladding layer 17 and both sides of the ridge 6 are buried by the current blocking layers 9 having a carrier concentration of $1.0 \times 10^{18} cm^{-3}$. A p-type GaAs second contact layer 12 having a thickness of 0.5 to 2.0 μm is disposed on the entire surface of the ridge 6 and the current blocking layer 9. An n side electrode comprising AuGe 50 nm thick, Ni 50 nm thick, and Au 300 nm thick is disposed on the rear surface of the n-type GaAs substrate 1 and a p side electrode comprising Ti 50 nm thick and Au 300 nm thick is disposed on the upper surface of the device. Thus, a semiconductor laser device 300 μm wide, 300 to 600 μm long, and 100 μm high is completed. Here, the composition of the light reflecting layer 5, $Al_zGa_{1-z}As$, is the same as the etch stopping layer of the prior art semiconductor device.

Figure 4A:
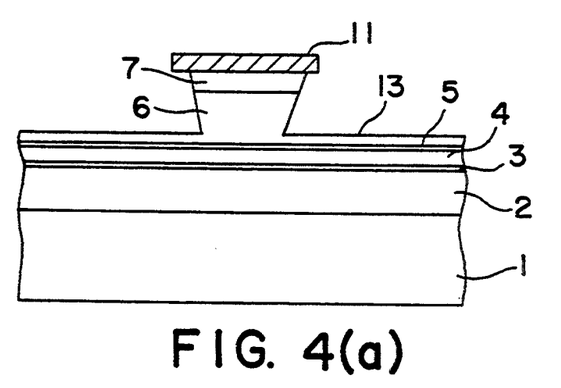
FIGS. 4(a) and 4(b) are diagrams for explaining production of the first embodiment of the present invention.
Figure 4B:
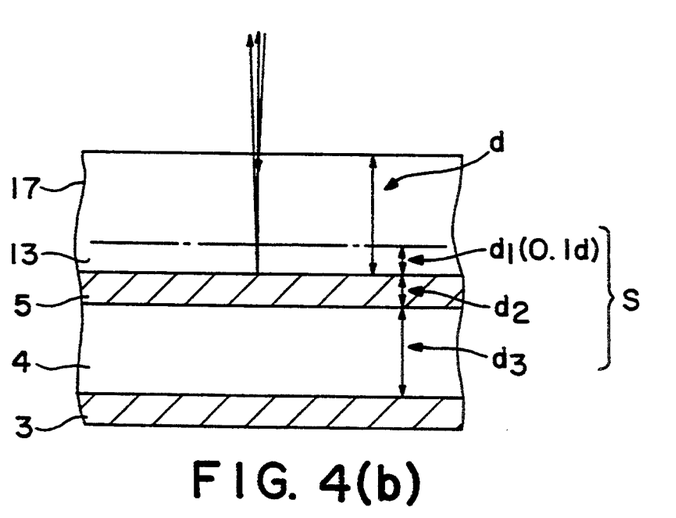

FIGS. 4(a) and 4(b) show a process for producing a semiconductor laser according to the first embodiment where FIG. 4(a) is a cross-sectional view of the wafer that has been processed through preparing the thin film 13 of the second cladding layer 17, and FIG. 4(b) is a diagram for explaining a method for preparing the thin film 13 by stopping etching after a prescribed time has passed following the first observation of light interference produced by light irradiating the second cladding layer 17 that is reflected by the light reflecting layer 5 and interferes with the incident light.

On the n-type GaAs substrate 1, successively grown by MOCVD, are the n-type AlGaAs cladding layer 2, the active layer 3, the p-type AlGaAs first cladding layer 4, the AlGaAs light reflecting layer 5, the p-type AlGaAs second cladding layer 17, and the p-type GaAs contact layer. Thereafter, the stripe-shaped insulating film 11 is formed. Up to this step, the process is the same as that in the prior art method shown in FIGS. 3(a) and 3(b).

Thereafter, a ridge is formed by etching with a solution of tartaric acid and hydrogen peroxide that etches AlGaAs having an Al composition ratio less than 0.6, while irradiating the second cladding layer 17 with light, for example, white light. Then, as the layer thickness of the second cladding layer 17 at the etched portion becomes gradually thinner, incident light in the second cladding layer 17 and light reflected by the light reflecting layer 5 interfere with each other, producing interference fringes. Light interference having various wavelength components including, for example, red light of wavelength λ=6500 Å, can be observed. This light interference is observed because the refractive index n1 of the second cladding layer 17 and the refractive index n2 of the light reflecting layer 5 are different from each other and n2>n1. The refractive index of AlGaAs becomes smaller as Al composition ratio increases.

If the refractive index of the second cladding layer 17 and the refractive index of the light reflecting layer 5 are constant, the thickness of the remaining film 13 of the second upper cladding layer 17 when the light interference begins to be observed, for example, about 0.5 μm, is always constant for any wafer and, therefore, the time t from when the interference fringes begin to be observed until the interference fringes entirely disappear is also constant.

Therefore, the time from the beginning of observation of light interference during ridge etching until the etching reaches the light reflecting layer 5 is measured by monitoring the light interference for a particular wafer and is set as t (for example, 5 minutes). The etching conditions are set so that the etching time is, for example, 0.9 t, leaving time 0.1 t, relative to the total etching time t. The thickness of the second cladding layer 17 left is 0.1 d, corresponding to 0.1 t. If etching is stopped when a time of 0.9 t has passed after the light interference begins to be observed, a thin film 13 with a thickness of 0.1 d (d1 is shown in FIG. 4(b)) is left successfully. Thereafter, the n-type GaAs current blocking layers 9 are grown on the thin film 13 as in the prior art method.

As described above, in this first embodiment, the thin film 13 of the second cladding layer 17 is left on the light reflecting layer 5 and the n-type GaAs current blocking layer 9 is not grown on an AlGaAs layer having an Al composition ratio greater than 0.6 as in the prior art method but on a thin film 13 on the second cladding layer 17 having an Al composition ratio that is smaller than that of the light reflecting layer 5, for example, about 0.5. Therefore, the surface defect density on the thin film 13 of the p-type cladding layer 17 is drastically reduced from $10^6/cm^{-2}$ to $10^4/cm^{-2}$ and surface morphology is significantly improved. This reduction in defect density also leads to a large reduction in leakage current so that device characteristics and reliability are greatly improved.

In addition, the thickness S of the p-type layers other than at the ridge 6 is

S=(thickness d1 of the thin film layer 13 of the p-type second upper cladding layer 17)
+(thickness d2 of the light reflecting layer 5)
+(thickness d3 of the p-type first upper cladding layer 4).

S is desirably controlled within an error of ±0.05 μm in a range of S<0.3 μm to keep the threshold current of the laser small. When this thickness S is larger, the current is broadened in the transverse direction and the threshold current is increased. The thickness d2 of the light reflecting layer 5 and the thickness d3 of the cladding layer 4 can be controlled with high precision during epitaxial growth and, by controlling the thickness d1 of the thin film layer 13 in the above-described method with high precision, the total thickness of the p-type first upper cladding layer 4, the light reflecting layer 5, and the thin film 13 of the p-type second upper cladding layer 17 can be controlled with a precision better than 0.3 μm, so that broadening of the current in the transverse direction is reduced, and highly reliable semiconductor lasers having uniform device characteristics are obtained.

In addition, by observing the interference of the light reflected by the light reflecting layer 5 and stopping the etching when a predetermined time of 0.9 t has passed after the light interference begins to be seen, a thin film 13 with a thickness 0.1 d corresponding to the time 0.1 t, during which the second p-type cladding layer 17 entirely disappears, is left. Control of the thickness of the thin film is quite easy, and semiconductor laser devices having high reproducibility and uniformity of device characteristics are obtained.

Embodiment 2

Figure 5A:
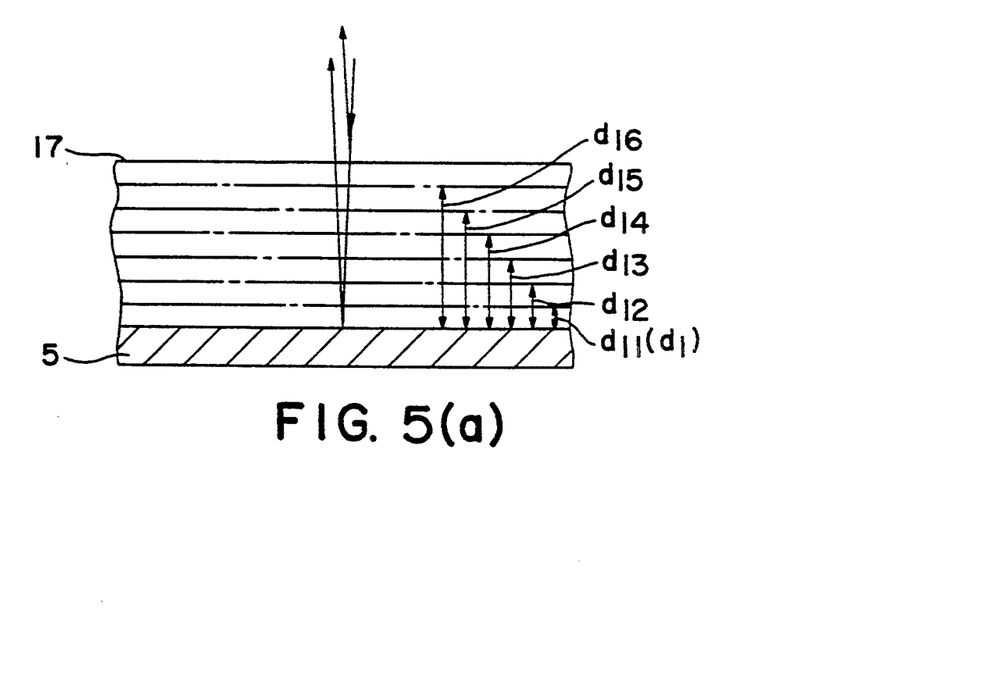
FIGS. 5(a) and 5(b) are diagrams for explaining production of a second embodiment of the present invention.
Figure 5B:
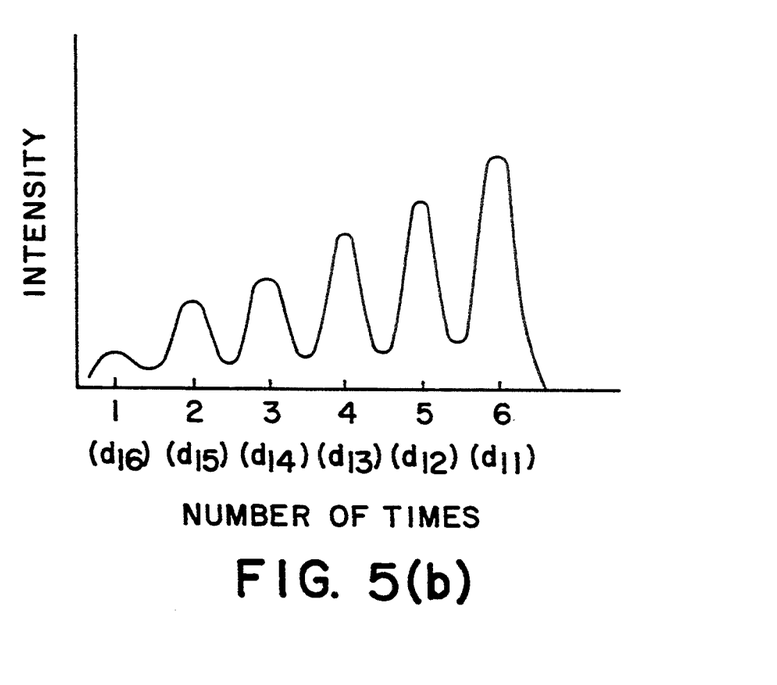

FIGS. 5(a) and 5(b) are diagrams for explaining a method of producing a semiconductor laser according to a second embodiment of the present invention. FIG. 5(a) is a diagram for explaining counting the number of times when the light interference of a particular wavelength periodically appears and stopping the etching upon observation of appearance of interference light a predetermined number of times, thereby leaving a thin film on the second p-type upper cladding layer. FIG.

5(b) is a diagram showing the periodic light interference that is observed.

In this second embodiment, as in the method of producing the first embodiment described above, the n-type AlGaAs lower cladding layer 2, the active layer 3, the p-type AlGaAs first upper cladding layer 4, the AlGaAs light reflecting layer 5, the p-type AlGaAs second upper cladding layer 17, and the p-type GaAs contact layer 7 are successively grown by MOCVD on the n-type GaAs substrate 1. Thereafter, a stripe-shaped insulating film 11 is formed and etching is carried out with a solution of tartaric acid and hydrogen peroxide that etches an AlGaAs layer having an Al composition ratio less than 0.6, employing the insulating film 11 as an etching mask, thereby producing a thin film layer 13, as shown in FIG. 4(a). The thin film 13 is left by observing when light interference appears periodically, counting the number of periods until the cladding layer 17 entirely disappears, and stopping the etching after the observation of the predetermined number of periods. In other words, while the color of the light interference that is generated during etching of the p-type cladding layer 17 changes, its wavelength λ periodically satisfies the following formula (1).

$$N \cdot \lambda/2 = n \cdot d \qquad (1)$$

where

λ: wavelength of light
n: refractive index of the p-type cladding layer 17
N: integer
d: layer thickness of the p-type cladding layer 17.

The color (wavelength) of the light interference changes with the layer thickness of the p-type second cladding layer 17 and a particular wavelength appears periodically. More particularly, when the light interference begins to be observed from the layer thickness d, the same wavelength light is observed N times until the etching reaches the light reflection layer 5.

Accordingly, when the number of times N that the light interference of a particular wavelength, such as red light, appears is counted while monitoring a wafer of the same construction and the etching is stopped when the observation of the light interference has occurred N times during ridge etching of the p-type second cladding layer 17, the remaining layer thickness d1 of the p-type second cladding layer 17 becomes $$d1 = \lambda/2nN$$

where

λ: wavelength of light
n: refractive index of the p-type cladding layer 17
N: integer
d1: remaining thickness of the p-type cladding film 13.

Although the number of times N that the light interference of the particular wavelength repeatedly appears can also be obtained theoretically, it is preferable to determine the number of times N by etching while monitoring a wafer of the same construction because the determination of the time when the light interference actually begins to be observed is difficult to predict.

In this way, when light, for example, white light, irradiates a part of the second upper cladding layer 17 that is etched, there is interference between the incident light in the p-type second cladding layer 17 and the light reflected by the light reflecting layer 5. Each time the layer thickness d of the p-type second upper cladding layer 17 that is being etched becomes an integer multiple of a predetermined wavelength λ (for example, λ=6500 Å), the light of wavelength λ appears strongly. Therefore, in this second embodiment, as the p-type second upper cladding layer 17 becomes successively thinner, i.e., a thickness of d16, d15, d14, d13, d12, and d11 (=d1), the light interference changes its wavelength, i.e., its color, successively. A particular wavelength light, for example, red light of wavelength λ=6500 Å, is observed six times, as shown in FIG. 5(b), d16 to d11 (=d1), as the p-type second cladding layer 17 becomes thinner. Therefore, by stopping etching after the light interference is seen six times during ridge etching, it is possible to leave a desired thickness d11 (=d1) as the remaining thin film 13 of the second upper cladding layer 17. Here, the thickness of the second upper cladding layer 17 corresponding to the time from the first observation of red light interference until it is next seen is, for example, 0.094, a value obtained from the wavelength λ of the light interference and the refractive index n (about 3.5) of the p-type second upper cladding layer 17.

In this production method, the etching is stopped when light interference of a particular wavelength that appears periodically is seen N times so that the thin film 13 of the p-type second upper cladding layer 17 has a thickness d1 of a desired value, resulting in highly precise control of the thickness of the thin film 13.

Embodiment 3

Figure 6A:
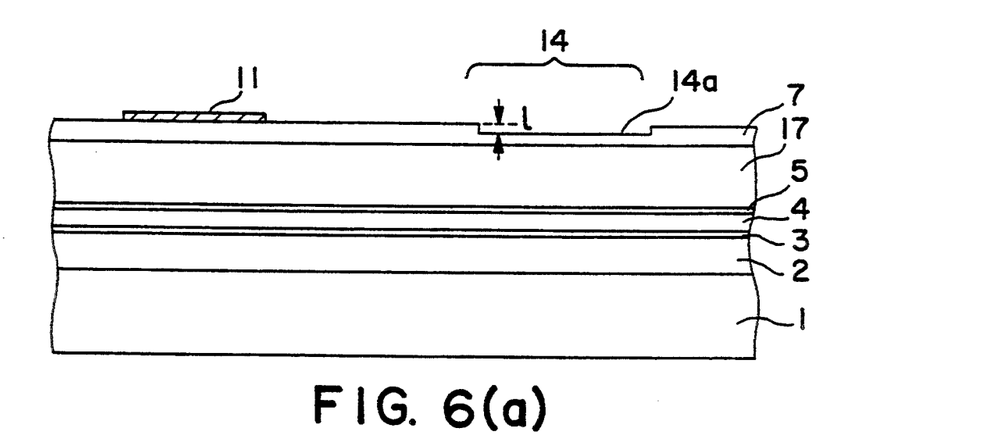
FIGS. 6(a) and 6(b) are diagrams for explaining production of the third embodiment of the present invention.
Figure 6B:
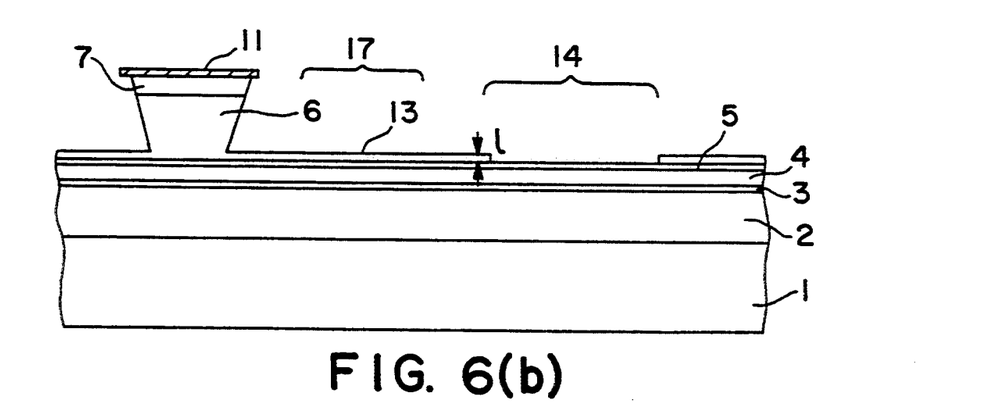

FIGS. 6(a) and 6(b) are diagrams of a method of producing a semiconductor laser according to a third embodiment of the present invention where FIG. 6(a) is a cross-sectional view of a wafer before ridge etching is started and FIG. 6(b) is a cross-sectional view of the wafer after ridge etching is completed. In the figures, the same reference numerals are used to designate the same or corresponding elements as in FIG. 1. Reference numeral 14 designates a monitor region (hereinafter also referred to as a groove region) and reference numeral 14a designates a bottom region of the monitor region 14.

In this third embodiment, after producing the contact layer 7, a groove region 14 having a depth corresponding to the thickness of the thin film 13 of the p-type second upper cladding layer 17 is formed at the surface of the contact layer 7 except at the ridge region. Thereafter, ridge etching is carried out and, by stopping the ridge etching when the bottom surface 14a of the groove region 14 reaches the light reflecting layer 5, the thin film 13 of the p-type second upper cladding layer 17 is left with a thickness equal to the depth of the groove region 14.

As in the first embodiment, the n-type AlGaAs cladding layer 2, the active layer 3, the p-type AlGaAs first upper cladding layer 4, the AlGaAs light reflecting layer 5, the p-type AlGaAs second upper cladding layer 17, and the p-type contact layer 7 are successively grown by MOCVD and, thereafter, the stripe-shaped insulating film 11 is produced.

Next, as shown in FIG. 6(a), a monitor region 14 having a groove of depth l is produced at a location other than the region that becomes a device region on the p-type GaAs contact layer 7. The depth l of the monitor region 14 can be measured with a surface roughness meter or a step meter.

Next, ridge etching is carried out with a solution of tartaric acid and hydrogen peroxide and the contact layer 7 and the p-type second upper cladding layer 17 are successively etched at the same speed, uniformly. When white light irradiates this etching, interference, for example, of red light of λ=6500 Å, is produced by the light that is reflected by the light reflecting layer 5 and interferes with the incident light at the monitor region 14. Then, the light interference repeats strongly or weakly, depending on the varying layer thickness. When the bottom surface 14a of the monitor region 14 reaches the light reflecting layer 5, that is, when the p-type second upper cladding layer 17 at the monitor region 14 is completely removed, the light interference completely stops and the etching is stopped. Thereby, the thin film 13 of the p-type second upper cladding layer 17 is left with a thickness of l outside the monitor region 14.

In this third embodiment, a groove-shaped monitor region 14 of a depth l corresponding to the film thickness d1 of the thin film 13 is formed at the surface of the contact layer 7 and, when the light interference completely stops, meaning that the bottom surface 14a of the monitor region 14 has reached the light reflecting layer 5, the etching is stopped. Therefore, the thin film 13 of the p-type second upper cladding layer 17 is left in a thickness l on the light reflecting layer 5 and, in addition to the effect of the first embodiment, a thin film of a required thickness is precisely obtained. In addition, because the etching is stopped when the light interference disappears, the conclusion point can be detected quite easily.

The conductivity types of the respective semiconductor layers in the above-describes first to third embodiments can be interchanged, e.g., from p-type to n-type, with the same effects as described above.

In the above-described first to third embodiments, materials within the AlGaAs system are employed for the active layer 3 but the present invention can be applied to a laser producing a wavelength of about 800 nm and employing other materials, such as InGaAsP, with the same effects as described above.

According to a first embodiment of the present invention, a semiconductor laser device includes a first conductivity type semiconductor substrate; a first conductivity type lower cladding layer disposed on the first conductivity type semiconductor substrate; an active layer disposed on the lower cladding layer; a second conductivity type first upper cladding layer disposed on the active layer; a second conductivity type $Al_zGa_{2-z}As$ light reflecting layer disposed on the first upper cladding layer, where z is at least 0.6; a second conductivity type second upper cladding layer comprising $Al_yGa_{1-y}As$ including a stripe-shaped ridge and thin film portions disposed on the light reflecting layer; and first conductivity type current blocking layers disposed on both sides of the second upper cladding layer, burying the ridge. The surface defect density is reduced from $10^6/cm^2$, produced in the prior art, to $10^4/cm^2$ and, thus, the surface morphology is significantly improved and a highly reliable semiconductor laser device having preferred device characteristics is obtained.

According to a second embodiment of the present invention, a semiconductor laser device has a total thickness in the first upper cladding layer, the light reflecting layer, and the thin film portion of the second upper cladding layer no larger than 0.3 μm. Therefore, there is no idle current due to the injected current being broadened in the transverse direction opposite the current blocking layers, whereby preferred device characteristics are obtained.

According to a third embodiment of the present invention, a method of producing semiconductor laser devices includes, on a first conductivity type semiconductor substrate, successively epitaxially growing a first conductivity type lower cladding layer, an active layer, a second conductivity type first upper cladding layer, a second conductivity type $Al_zGa_{1-z}As$ light reflecting layer, where z is at least 0.6, a second conductivity type second upper cladding layer comprising $Al_yGa_{1-y}As$, and a second conductivity type first contact layer. The first contact layer and the second upper cladding layer are etched, producing a stripe-shaped ridge as well as leaving thin film portions of the second upper cladding layer at both sides of the ridge. First conductivity type current blocking layers are grown on the thin film portions of the second upper cladding layer, burying the ridge, and producing a second conductivity type second contact layer on the entire top surface of the ridge and the current blocking layers. The surface morphology is significantly improved and a highly reliable semiconductor laser device having preferred device characteristics is fabricated.

According to fourth and fifth embodiments of the present invention, the process of leaving the thin film portions at both sides of the second upper cladding layer comprises observing light interference produced by light irradiating and reflected from the second upper cladding layer that becomes gradually thinner during ridge etching and light propagating in and returned from the second upper cladding layer, and stopping the etching when a predetermined time has passed since the light interference was first seen or when a particular wavelength light has been observed a predetermined number of times.

By changing the etching time, the thickness of the thin film can be controlled and, therefore, the second upper cladding layer can be made thin with high reproducibility. Highly reliable semiconductor laser devices that are superior in the reproducibility and uniformity of device characteristics are obtained.

According to a sixth embodiment of the present invention, the process of leaving the thin film portions at both sides of the second upper cladding layer comprises, after producing the first contact layer, producing a groove having a depth corresponding to the thickness of the thin film layer at the surface of the first contact layer that is subjected to ridge etching and observing the light interference obtained from light irradiating and reflected from the second upper cladding layer at the groove. The semiconductor cladding layer becomes gradually thinner during the ridge etching and light propagating in and returned from the second upper cladding layer at the groove is observed. Etching is stopped when the light interference disappears, leaving thin film portions at both sides of the second upper cladding layer. The thin film portions of the second upper cladding layer can be left with a high precision thickness on the light reflecting layer and highly reliable semiconductor laser devices superior in the reproducibility and uniformity of the device characteristics are obtained.

What is claimed is:

1. A semiconductor laser device comprising:
a first conductivity type semiconductor substrate;

a first conductivity type lower cladding layer disposed on said first conductivity type semiconductor substrate;

an active layer disposed on said lower cladding layer;

a second conductivity type first upper cladding layer disposed on said active layer, the second conductivity type being opposite to said first conductivity type;

a second conductivity type $Al_zGa_{1-z}As$ light reflecting layer disposed on said first upper cladding layer, wherein z is at least 0.6;

a second conductivity type second upper cladding layer comprising $Al_yGa_{1-y}As$, wherein y is less than z, including a central stripe-shaped ridge and thin film layer portions at both sides of said stripe-shaped ridge disposed on said light reflecting layer;

first conductivity type current blocking layers disposed on both of said thin film layer portions of said second upper cladding layer and contacting opposed sides of said stripe-shaped ridge; and a second conductivity type first contact layer disposed on said stripe-shaped ridge.

2. The semiconductor laser device of claim 1 wherein said first upper cladding layer, said light reflecting layer, and said thin film layer portion of said second upper cladding layer have a total thickness no larger than 0.3 $\mu$m.

3. The semiconductor laser device of claim 1, wherein said first conductivity type is n type, and said second conductivity type is p type.

4. The semiconductor laser device of claim 2, wherein said first conductivity type is n type, and said second conductivity type is p type.

5. The semiconductor laser device of claim 1 wherein said first contact layer is disposed on and is part of said stripe-shaped ridge and comprising a second conductivity type second contact layer disposed on and in contact with said first contact layer and said current blocking layers.

6. The semiconductor laser device of claim 1 including a first electrode disposed in electrical contact with said semiconductor substrate and a second electrode disposed in electrical contact with said first contact layer.

* * * * *